(12) United States Patent
Chang et al.

(10) Patent No.: US 8,765,615 B1
(45) Date of Patent: Jul. 1, 2014

(54) QUARTZ-BASED MEMS RESONATORS AND METHODS OF FABRICATING SAME

(75) Inventors: David T. Chang, Calabasas, CA (US); Frederic P. Stratton, Beverly Hills, CA (US); Hung Nguyen, Los Angeles, CA (US); Randall L. Kubena, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 465 days.

(21) Appl. No.: 12/816,292

(22) Filed: Jun. 15, 2010

(51) Int. Cl.
*H01L 21/302* (2006.01)
*H01L 21/311* (2006.01)
*H01L 21/3105* (2006.01)

(52) U.S. Cl.
CPC .... *H01L 21/31111* (2013.01); *H01L 21/31056* (2013.01)
USPC ............................ 438/756; 438/745; 438/700

(58) Field of Classification Search
None
See application file for complete search history.

(56) References Cited

U.S. PATENT DOCUMENTS

| | | | | |
|---|---|---|---|---|
| 5,261,277 | A | * | 11/1993 | Thomas et al. ............. 73/514.15 |
| 7,237,315 | B2 | | 7/2007 | Kubena ............................ 29/594 |
| 7,647,688 | B1 | * | 1/2010 | Chang et al. .................... 29/594 |
| 2004/0132310 | A1 | * | 7/2004 | Nakatani et al. .............. 438/706 |
| 2007/0017287 | A1 | * | 1/2007 | Kubena et al. ............. 73/504.02 |
| 2008/0036335 | A1 | * | 2/2008 | Naito et al. .................... 310/361 |
| 2008/0258829 | A1 | * | 10/2008 | Kubena et al. ................ 331/158 |

* cited by examiner

*Primary Examiner* — Shamim Ahmed
*Assistant Examiner* — Bradford Gates
(74) *Attorney, Agent, or Firm* — Ladas & Parry

(57) ABSTRACT

A quart resonator for use in lower frequency applications (typically lower than the higher end of the UHF spectrum) where relatively thick quartz members, having a thickness greater than ten microns, are called for. A method for fabricating same resonator includes providing a first quart substrate; thinning the first quartz substrate to a desired thickness; forming a metallic etch stop on a portion of a first major surface of the first quartz substrate; adhesively attaching the first major surface of the first quartz substrate with the metallic etch stop formed thereon to a second quartz substrate using a temporary adhesive; etching a via though the first quartz substrate to the etch stop; forming a metal electrode on a second major surface of the first quartz substrate, the metal electrode penetrating the via in the first quartz substrate to make ohmic contact with the metallic etch stop; bonding the metal electrode formed on the second major surface of the first quartz substrate to a pad formed on a substrate bearing oscillator drive circuitry to form a bond there between; and dissolving the temporary adhesive to thereby release the second quartz substrate from the substrate bearing oscillator drive circuitry and a portion of the first quartz substrate bonded thereto via the bond formed between the metal electrode formed on the second major surface of the first quartz substrate to and the pad formed on the substrate bearing oscillator drive circuitry.

24 Claims, 4 Drawing Sheets

QUARTZ-BASED MEMS RESONATORS AND METHODS OF FABRICATING SAME

STATEMENT REGARDING FEDERAL FUNDING

This invention was made under U.S. Government contract 2007-1095-726-000. The U.S. Government has certain rights in this invention.

CROSS REFERENCE TO RELATED APPLICATIONS

None

TECHNICAL FIELD

This invention relates to quartz-based Micro ElectroMechanical Systems (MEMS) resonators and methods of fabricating same, particularly for resonators having relatively thick quartz members for operation at frequencies below approximately

BACKGROUND

The technology disclosed in U.S. Pat. No. 7,237,315 issued Jul. 3, 2007 and entitled "Method for Fabricating a Resonator" is improved upon by this invention. Both the prior art and this invention use similar MEMS fabrication technology to form a quartz resonator structure. However, the technology disclosed in U.S. Pat. No. 7,237,315 really works best when used to make resonators which operate at frequencies at the upper end of the UHF band or even higher.

But there is a need for quartz resonators which operate at even lower frequencies (less than 50 MHz, for example). A problem arises when using the technology of U.S. Pat. No. 7,237,315 to try to make lower frequency resonators—the thickness of the quartz resonator must be increased, but due to the vastly different quartz thicknesses between the higher end of the UHF band in one hand and lower frequency devices on the other hand (several microns of quartz thickness for the upper UHF frequency devices compared with several tens or hundreds of microns thickness for lower frequency devices), the soft photoresist mask used in U.S. Pat. No. 7,237,315 cannot be successfully utilized. In U.S. Pat. No. 7,237,315 the photoresist is the "soft" mask which is used with plasma dry etching. In this disclosure a "hard" mask is used instead because the presently disclosed method uses a wet etchant at an elevated temperature for typically many hours. A "soft" mask can not withstand such an aggressive wet etch and therefore a Cr/Au (metal hard) mask is suggested herein. The soft masks can be seen used in FIGS. 1$f$ and 1$h$ of the prior art which are used for etching the via and the resonator.

This invention also introduces a novel quartz resonator temporary attachment and release technology that can increase device yield and lower cost. In U.S. Pat. No. 7,237,315 silicon or GaAs were used as the handle wafer because the quartz resonator wafer was bonded to the handle using a room temperature direct bond without any adhesives. The handle can be dissolved or etched away later using a preferential etch that does not attack quartz. As long as you can find a material that can be directly bonded to quartz at room temperature and preferentially removed later, you can use it.

In this disclosure, a quartz handle is suggested, which is inconsistent with the prior art because with the prior art direct bonding process the quartz handle can not be preferentially removed without also attacking to the quartz resonator wafer.

Also not having to form the cavity in the handle as done in the prior art is an improvement for the quartz handle in that putting a cavity into a quartz substrate can be omitted. The adhesive bond to the handle is a high temperature bond that occurs at 150° C. (for example).

The process flow from the above-identified US patent is shown, in simplified form, by FIGS. 1$a$-1$k$. The process begins by providing a quartz substrate 2 having a first surface 3 and a second surface 5, a silicon or GaAs handle substrate 4, and a base or host substrate 14. A portion of the silicon handle substrate 4 is etched away creating a cavity 6, as shown in FIG. 1$b$. The etched cavity 6 can be fabricated with a wet etch of potassium hydroxide, or a dry reactive ion etch using a gas having a fluorine chemistry. Then, top-side electrode and tuning pad metal (Al or Au) 7 is deposited onto a quartz substrate 2 as shown by FIG. 1$c$. Next, the two wafers 2, 4 are brought together using a direct bonding process as depicted by FIG. 1$d$. After a low temperature bonding/annealing operation, a combination of processes including wafer grinding/lapping, chemical-mechanical-planarization (CMP), plasma etching and chemical polishing is used to thin the quartz down to a thickness, typically less than 10 microns, for a desired resonant frequency as depicted by FIG. 1$e$. Next, photolithography is used to pattern contact via holes in the thinned quartz layer 2. The holes are etched through quartz to stop on top-side electrode metal 7 and then metallized to form the through-wafer metal vias 11 as shown in FIG. 1$f$. The bottom-side electrodes 12 are then metallized (see FIG. 1$g$), and the quartz layer is patterned and etched (see FIG. 1$h$) to form an array of resonators. Finally, protrusions are etched into the host substrate 14, and metalization patterns 16, including bonding pads, are defined on the substrate 14 as depicted by FIG. 1$i$. The quartz/silicon pair 2,4 is bonded to the host wafer 14 using either a Au—Au or Au—In compression bonding scheme (see FIG. 1$j$), and the silicon handle wafer 4 is thereafter removed with a combination of dry and wet etches, resulting in the quartz resonators being attached only to the host wafer, as shown in FIG. 1$k$. The prior art uses a spin coating of a soft mask (photoresist) for patterning of the metal, quartz and silicon structures.

BRIEF DESCRIPTION OF THE INVENTION

In one aspect the present invention provides a method for fabricating a resonator, the steps of which include: providing a first quart substrate; thinning the first quartz substrate to a desired thickness; forming a metallic etch stop on a portion of a first major surface of the first quartz substrate; adhesively attaching the first major surface of the first quartz substrate with the metallic etch stop formed thereon to a second quartz substrate using a temporary adhesive; etching a via though the first quartz substrate to the etch stop; forming a metal electrode on a second major surface of the first quartz substrate, the metal electrode penetrating the via in the first quartz substrate to make ohmic contact with the metallic etch stop; bonding the metal electrode formed on the second major surface of the first quartz substrate to a pad formed on a substrate bearing oscillator drive circuitry to form a bond there between; and dissolving the temporary adhesive to thereby release the second quartz substrate from the substrate bearing oscillator drive circuitry and a portion of the first quartz substrate bonded thereto via the bond formed between the metal electrode formed on the second major surface of the first quartz substrate to and the pad formed on the substrate bearing oscillator drive circuitry.

DETAILED DESCRIPTION

The resonant frequency of a thickness-shear mode quartz resonator is inversely proportional to the quartz layer thickness. Both this invention and the prior art listed describe thickness-shear mode devices, the former operating at HF-UHF bands, and the latter at VHF-UHF bands.

Figure 1A:
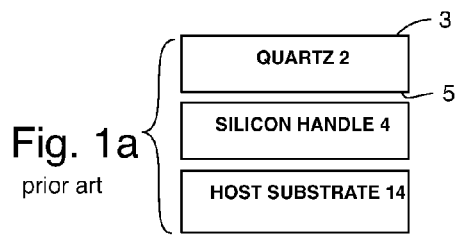
FIGS. 1$a$-1$l$ depict a known process for making a UHF and higher frequency resonator with a quartz substrate.
Figure 1B:
Figure 1C:
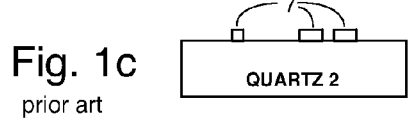
Figure 1D:
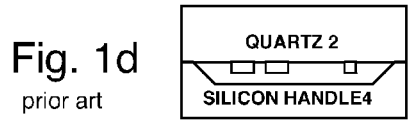
Figure 1E:
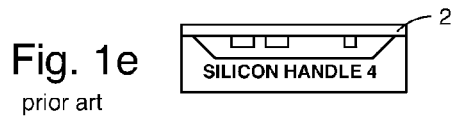
Figure 1F:
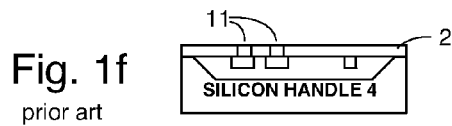
Figure 1G:
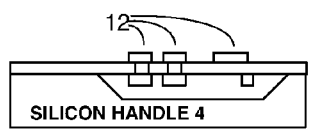
Figure 1H:
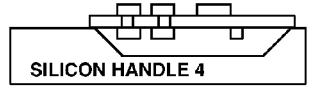
Figure 1I:
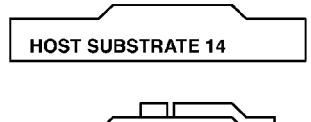
Figure 1J:
Figure 1K:
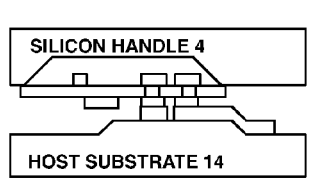
Figure 1L:
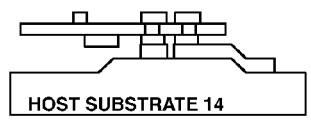
Figure 2A:
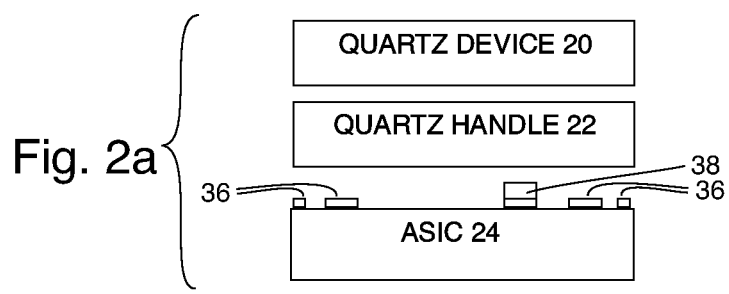
FIG. 2a depicts the starting materials: a quartz device wafer, a quartz handle wafer, and oscillator ASIC wafer.
Figure 2B:
FIG. 2b shows a top side electrode/etch stop metalization formed on the quartz device wafer.

A preferred embodiment of the process flow for quartz resonator fabrication according to the present invention is illustrated in FIGS. 2a-2l. As depicted by FIG. 2a, the starting materials preferably consist of a quartz device wafer 20 (for the resonator), a quartz handle wafer 22, and a host substrate 24 (such as a silicon CMOS ASIC wafer with oscillator drive circuitry disposed thereon). A quartz handle wafer 22 is chosen instead of a silicon handle used in the prior art because it offers better thermal matching to the quartz device wafer 20. In order to obtain the best thermal match between the quartz handle wafer 22 the quartz resonator wafer 20, one should preferably use wafers of the same starting crystal orientation because quartz is an anisotropic material that has two different coefficients of thermal expansion (CTE—which occur parallel or perpendicular to the z axis of the crystal). For example, a Z-cut quartz resonator wafer 20 should preferably be bonded to a Z-cut quartz handle wafer 22 and an AT-cut (35 degrees rotated from z-axis) quartz resonator wafer 20 should preferably be matched with an AT-cut quartz handle wafer 22.

Thermally (CTE) matched wafers 20, 22 are used for the handle wafer 22 and for the quartz device wafer 20, otherwise, the bonded pair 20, 22 would either warp severely or break due to the stress caused by thermal expansion mismatch between the quartz resonator wafer and the Ga or Si handle. A silicon-quartz or GaAs-quartz bonded pair as used in U.S. Pat. No. 7,237,315 will likely fail during a hot ammonium bifluoride wet etch, for example, due to the thermal expansion mismatch between such materials.

Fabrication begins with forming a top-side metalization 26 on a portion of the quartz device wafer 20 preferably using conventional fabrication techniques known to those skilled in the art. See FIG. 2b. This metalization 26 is preferably formed as a metal stack (e.g., layers of Cr and Au with the Cr closest to the quartz device layer 20) and is used to form the top electrode of the resonator and also to act as an etch stop for a subsequent etch.

Figure 2C:
FIG. 2c depicts a temporary adhesive applied to quartz handle wafer.
Figure 2D:
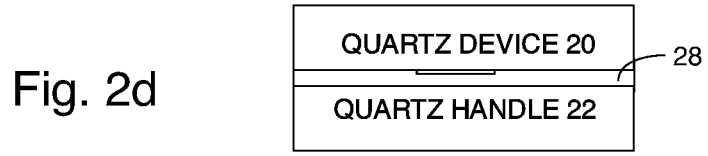
FIG. 2d depicts the quartz device wafer temporally bonded to quartz handle wafer.
Figure 2E:
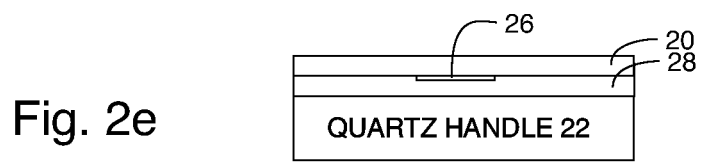
FIG. 2e shows the effect of grinding and polishing quartz device wafer a desired thickness.
Figure 2F:
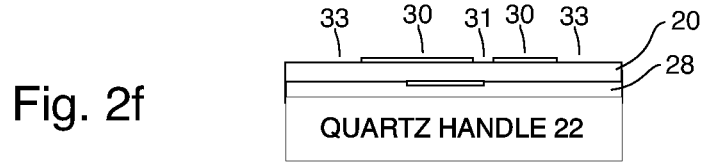
FIG. 2f depicts the metalization formed and patterned using photolithographic techniques as wet etch mask for both vias and resonators.
Figure 2G:
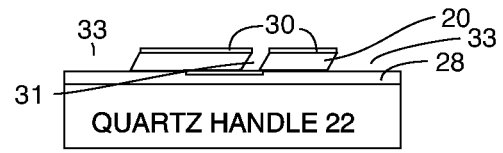
FIG. 2g shows the effect of wet etching quartz vias and resonators for both vias and resonators.

Turning to FIG. 2c, a temporary adhesive 28, either a petroleum-based wax or a high temperature epoxy, is coated or otherwise applied onto the handle wafer 22. The quartz device wafer 20 is then bonded to the handle 22 using the previously applied adhesive 28 to form a thermo-compression bond there between as shown by FIG. 2d. A preferred adhesive 28 is a petroleum-based wax sold under the trade name Apiezon W by SPI Supplies/Structure Probe, Inc. of West Chester, Pa. 19381. This wax can be dissolved using tetrachloroethylene when time comes to free the completed resonator from the handle wafer 22 (discussed below with reference to FIG. 2k).

The quartz device wafer 20 is subsequently thinned to a desired thickness (see FIG. 2e) to reflect the operating frequency preferably using both wafer grinding and chemical mechanical planarization (CMP) techniques to reduce the thickness of the quartz device wafer 20 to a desired thickness. The resulting thickness of the quartz device wafer 20 ranges from ten microns to hundreds of microns.

Next, a metalization layer 30, such as Cr/Au (preferably comprising one or more layers of Au on one or more layers of Cr with a Au layer preferably comprising a final exposed layer of the Cr/Au sandwich), is deposited and etched to form a via openings 31 and 33. The resonator mask 30 also depicted by FIG. 3. The mask 30 is used for wet etching of the thinned quartz device wafer 20. A through-wafer etch of the thinned quartz device layer 20 is preferably performed in either a saturated ammonium bifluoride solution or hydrofluoric acid. The wet etchant stops etching via 31 when the wet etchant reaches metalization 26 (which also serves as an etch stop layer 26 and as the resonator's top electrode as discussed above with reference to FIG. 2b). The metalization/etch stop 26 only acts as an etch stop for only one of the three vias depicted (via 31). The other via (via 33) surrounds the quartz resonator arm 35 allowing it to be released from neighboring resonator arms (not shown) when the adhesive 28 is dissolved in a subsequent step. The etching of vias 31 and 33 preferably occur simultaneously.

Figure 2J:
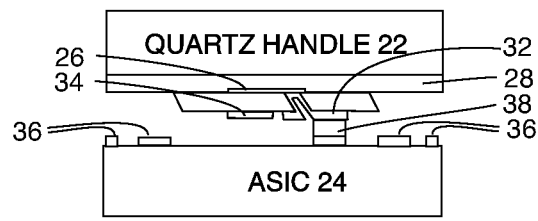
FIG. 2j depicts a wafer of quartz resonators being bonded (as full wafer bonding, but only one device is shown in this figure) to a wafer having a similar plurality oscillator ASICs formed hereon in appropriate positions to mate with the plurality of quartz resonators temporarily held by the quartz handle.
Figure 3:
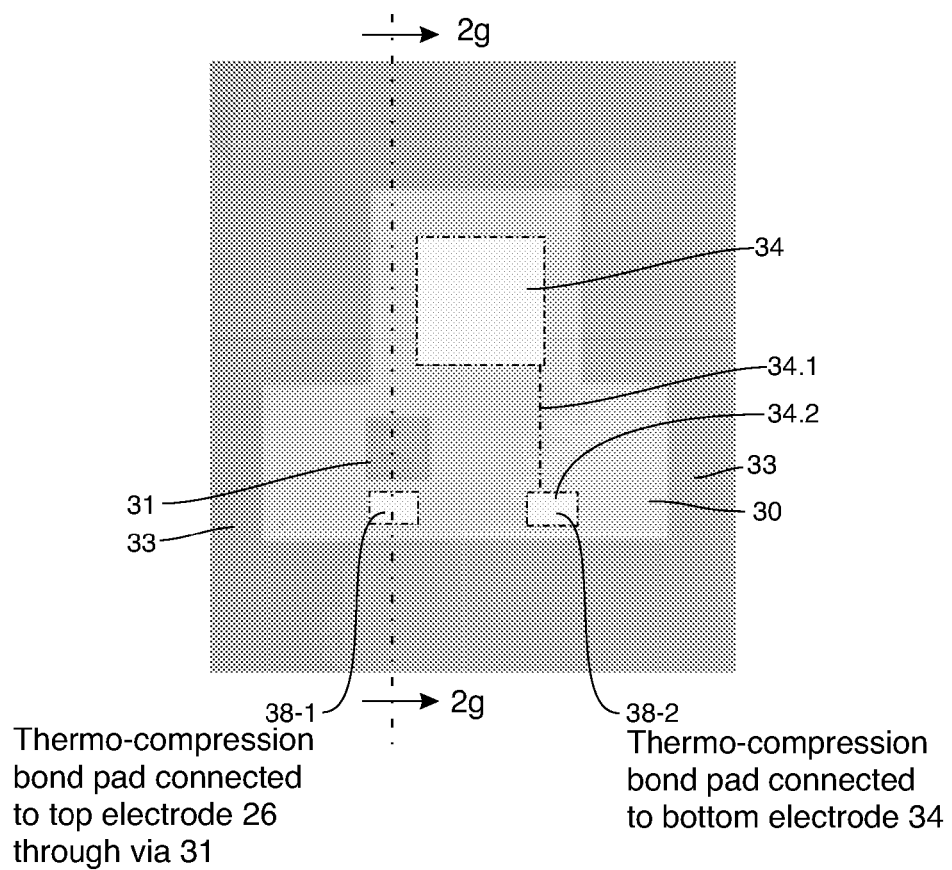
FIG. 3 depicts a plan view of the etch mask formed by an upper layer of metalization (also shown in elevational view by FIG. 2g) having an opening therein for etching a via through the quartz resonator to an underlying etch stop formed as discussed with reference to FIG. 2b.

In FIG. 3 three dashed box outlines 34, 38-1 and 38-2 are also depicted. These outlines depict the placement of elements formed during subsequent manufacturing steps. Outline 34 shows where the metalization 34 for resonator's bottom electrode will be preferably located (see also FIG. 2i and the related discussion below). Outline 38-1 shows where pad 38 will eventually align with metalization 32 for forming a thermo-compression bond to electrode 26 (see FIG. 2j and the related discussion below). Outline 38-2 shows where another pad on ASIC 24 will eventually align with a metalization 34.2 which is coupled to (and formed with) metalization 34 by means of a metalization connector 34.1 (shown by a dashed line in FIG. 3). Metalization 34.1 and 34.2 provide for ohmic contact between the bottom electrode 34 and circuitry of the ASIC 24.

Figure 2H:
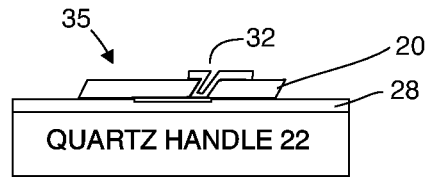
FIG. 2h depicts metalization deposited and patterned for via metal and for bond pads.
Figure 2I:
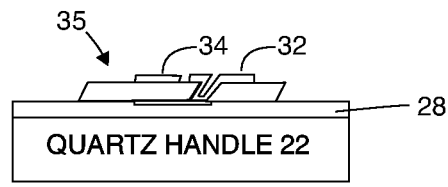
FIG. 2i depicts metalization deposited and patterned for a bottom side electrode.

Turning to FIG. 2h, the etch mask formed by metalization 30 is now stripped and a new layer of metalization 32, preferably formed of a stack of Cr/Au (preferably comprising one or more layers of Au on one or more layers of Cr with Au comprising the last exposed layer), is conformally deposited within via 31 and on the resonator arm 35 and etched to form a resonator bond pad and via metal 32 to connect to metalization 26 (which will become the top electrode after the device is inverted). The resonator bond pad shown in this view is the flat portion of metalization 32 which mates with the ASIC on wafer 24 as depicted by FIG. 2*j*. Another metalization layer 34, preferably also of a Cr/Au stack, is deposited and patterned to form what will become the bottom electrode 34 of the quartz resonator, as well metalization 34.1 and 34.2 shown in FIG. 3. Metalization 32 and 34, 34. and 34.2 are preferably formed together (that is, at the same time and therefore may have the same thickness, unless metalization 32 has more layers of Cr/Au than does metalization 34). Metalization 26 and 34, 34.1 and 34.2 preferably have the same thicknesses.

On the host substrate, ASIC 24, probe pads 36 (preferably comprising Cr/Pt/Au layers with Au comprising the last exposed layer) and substrate bond pads 38 for thermo-compression bonding (preferably comprising Cr/Pt/Au/In layers) are deposited. See FIGS. 2*a* and 2*j*, for example, which show these pads 36 and 38 (see also FIG. 3 which depicts where the substrate bond pads are preferably positioned by outlines 38.1 and 38.2).

The ASIC substrate 24 probe pads 36 and ASIC substrate 24 bond pads 38 are typically not fabricated at a silicon CMOS foundry where the remaining portions of the ASIC 24 are conventionally fabricated, so they are typically added as a post CMOS processing operation by the fabricator of the quartz resonator. The addition of these pads 36 and 38 to ASIC 24 is preferably done separately from the quartz fabrication of the resonator 35 itself, but these pads 36 and 38 need to be added before the quartz device/handle pair 20, 22 is aligned and bonded to ASIC 24 as is described below.

Only one substrate bond pad 38 is depicted in FIGS. 2*a* and 2*j*, and that pad 38 is used to ohmically connect metalization 26 to the circuitry of the ASIC via the pad 38 and metalization 32 depicted in FIG. 2*j*. It is to be understood, however, that a second substrate bond pad for thermo-compression bonding (preferably comprising Cr/Pt/Au/In layers) is also fabricated on ASIC 24, which second pad is used to ohmically connect metalization 34 to the circuitry of the ASIC via that a second substrate bond pad. The second substrate bond pad is not depicted in FIGS. 2*a* and 2*j*, since it is preferably located behind the pad 38 shown in these views, but spaced therefrom so as to be ohmically isolated from the pad 38 seen in these figures. The location of the second substrate bond pad is depicted by outline 38.2 of FIG. 3, however, Although not shown in FIGS. 2*i*-2*l* for ease of illustration, metalization 34 preferably extends behind metalization 32 to make contact with the aforementioned second substrate bond pad (via compression bonding) when substrate bond pad 38 is compression bonded to metalization 32. The metalization extending behind metalization 32 is shown as a dashed line 34.1 in FIG. 3 and the pad which mates with the aforementioned second substrate bond pad (outline 38-2) is shown as a dashed box 34.2 in FIG. 3.

Figure 2K:
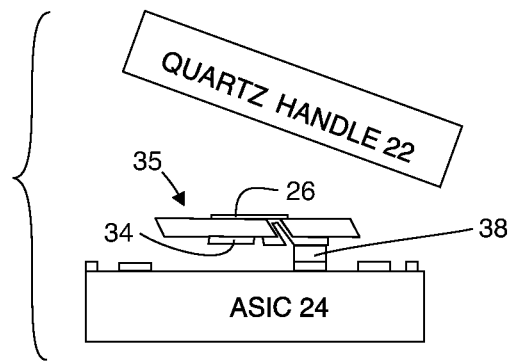
FIG. 2k depicts the temporary adhesive being dissolved to free quartz handle wafer and allow its removal.
Figure 2L:
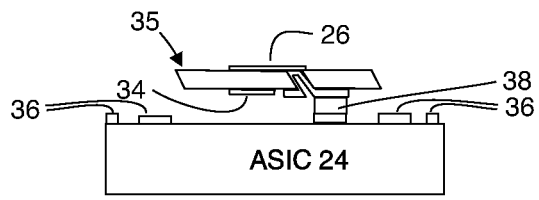
FIG. 2l depicts one of a plurality of released quartz resonators on ASIC wafer.

As shown by FIG. 2*j*, the quartz device/handle pair 20, 22 is then aligned and bonded to the host ASIC wafer 24 with a metal-metal (preferably Au to In) thermo-compression bond at the two substrate bond pads mentioned above, preferably using a commercial wafer bonder. The bonded stack can be soaked in an appropriate solvent to dissolve the adhesive 28, thus freeing the resonator 25 from the handle wafer 22 as shown in FIG. 2*k*. Since a plurality of resonators 25 are typically formed at one time (only one is completely shown in FIGS. 2*a*-2*l* as being formed for ease of illustration and explanation, but a two dimensional array of resonators 25 would preferably be formed at one time from a common sheet of quartz 20), a plurality of resonators 25 are released when a common quartz handle 22 is released by the aforementioned solvent. Dissolving the adhesive 28 with a solvent as opposed to etching the quartz handle away as done in the prior art is another advantage because the process is both quick and safe (it does not attack the completed quartz resonators).

The fully released devices (see FIG. 2*l*) are then preferably baked in a vacuum oven to completely rid themselves of any residual solvent and then preferably diced into individual resonators.

Having described the invention in connection with certain embodiments thereof, modification will now suggest itself to those skilled in the art. As such, the invention is not to be limited to the disclosed embodiment except as is specifically required by the appended claims.

What is claimed is:

1. A method of fabricating a resonator comprising:
providing a first quartz substrate having a desired thickness;
forming a metallic etch stop on a portion of a first major surface of the first quartz substrate;
adhesively attaching the first major surface of the first quartz substrate and the metallic etch stop formed thereon to a second quartz substrate using a temporary adhesive, the metallic etch stop being directly adhesively bonded to said second quartz substrate using said temporary adhesive;
etching a via though the first quartz substrate to the etch stop;
forming a metal electrode on a second major surface of the first quartz substrate, the metal electrode penetrating the via in the first quartz substrate to make ohmic contact with the metallic etch stop;
bonding the metal electrode formed on the second major surface of the first quartz substrate to a pad formed on a substrate bearing oscillator drive circuitry to form a bond there between; and
dissolving the temporary adhesive to thereby release the second quartz substrate from the substrate bearing oscillator drive circuitry and a portion of the first quartz substrate bonded thereto via the bond formed between the metal electrode formed on the second major surface of the first quartz substrate to and the pad formed on the substrate bearing oscillator drive circuitry.

2. The method of claim 1 wherein the metallic etch stop forms an electrode on the first major surface of the first quartz substrate.

3. The method of claim 2 wherein the electrode on the first major surface of the first quartz substrate comprises layers of Cr and Au with the Cr layer disposed closer to the first quartz substrate.

4. The method of claim 1 wherein the step of etching the via though the first quartz substrate to the etch stop comprises:
(a) defining a metallic mask on the second major surface of the first quartz substrate, the metallic mask including at least a first opening therein for said via and at least another opening therein for defining a perimeter shape of a quartz portion of said resonator; and
(b) etching through said at least a first opening in the metallic mask to thereby etch through the first quartz substrate to said etch stop and through said at least a another opening in the metallic mask to thereby etch through the first quartz substrate to define the perimeter shape of the quartz portion of said resonator.

5. The method of claim 4 wherein the etching step is performed using either a saturated ammonium bifluoride solution or hydrofluoric acid solution.

6. The method of claim 1 wherein a plurality of resonators are formed simultaneously from a single first quartz substrate, the first quartz substrate having a plurality of metallic etch stops, each etch stop being each formed on a portion of the first major surface of the first quartz substrate, said portion aligning with each one of said resonators for each one of said metallic etch stops, the etching step etching said vias in each of said resonators to each said etch stop, the etching step further etching second vias to said first quartz substrate, the second vias surrounding each one of said plurality of resonators.

7. The method of claim 1 wherein a second metallic electrode is formed on a second major surface of the first quartz substrate opposing the metallic etch stop formed on the first major surface of the first quartz substrate, the second metallic electrode and the first mentioned metallic electrode being electrically isolated and physically spaced from each other.

8. The method of claim 1 wherein the first and second quartz substrates are crystalline quartz.

9. The method of claim 1 wherein the first and second quartz substrates are crystalline quartz and share a common crystal orientation.

10. A method of fabricating a resonator comprising:
providing a first quartz substrate;
thinning the first quartz substrate to a desired thickness;
forming a metallic etch stop on a portion of a first major surface of the first quartz substrate;
adhesively attaching the first major surface of the first quartz substrate with the metallic etch stop formed thereon to a second quartz substrate using a temporary adhesive, wherein the temporary adhesive covers substantially all of an exposed surface of the first major surface of the first quartz substrate and all of the metallic etch stop formed thereon;
etching a via though the first quartz substrate to the etch stop;
forming a metal electrode on a second major surface of the first quartz substrate, the metal electrode penetrating the via in the first quartz substrate to make ohmic contact with the metallic etch stop;
bonding the metal electrode formed on the second major surface of the first quartz substrate to a pad formed on a substrate bearing oscillator drive circuitry to form a bond there between; and
dissolving the temporary adhesive to thereby release the second quartz substrate from the substrate bearing oscillator drive circuitry and a portion of the first quartz substrate bonded thereto via the bond formed between the metal electrode formed on the second major surface of the first quartz substrate to and the pad formed on the substrate bearing oscillator drive circuitry.

11. The method of claim 10 wherein the temporary adhesive is a petroleum-based wax.

12. The method of claim 10 wherein a second metallic electrode is formed on a second major surface of the first quartz substrate opposing the metallic etch stop formed on the first major surface of the first quartz substrate, the second metallic electrode and the first mentioned metallic electrode being electrically isolated and physically spaced from each other.

13. The method of claim 10 wherein the etching step includes etching the first mentioned via though the first quartz substrate to the etch stop and also etching a second via spaced laterally from the first mentioned via and spaced laterally from the metallic etch stop, the second via surrounding the resonator.

14. The method of claim 10 wherein the second quartz substrate has a planar region which is adhesively bonded to both the first quartz substrate and to the metallic etch stop formed on the first quartz substrate using said temporary adhesive which covers substantially all of the exposed surface of the first major surface of the first quartz substrate and all of the metallic etch stop formed thereon.

15. A method of fabricating a resonator comprising:
providing a first quartz substrate;
thinning the first quartz substrate to a desired thickness;
forming a metallic etch stop on a portion of a first major surface of the first quartz substrate;
adhesively attaching the first major surface of the first quartz substrate and the metallic etch stop formed thereon to a second quartz substrate using a temporary adhesive, the temporary adhesive covering substantially all of an exposed surface of the first major surface of the first quartz substrate and all of the metallic etch stop formed thereon;
after adhesively attaching the first major surface of the first quartz substrate and the metallic etch stop formed thereon to the second quartz substrate, simultaneously etching a first via though the first quartz substrate to the etch stop and a second via though the first quartz substrate to the temporary adhesive;
forming a metal electrode on a second major surface of the first quartz substrate, the metal electrode penetrating the via in the first quartz substrate to make ohmic contact with the metallic etch stop;
bonding the metal electrode formed on the second major surface of the first quartz substrate to a pad formed on a substrate bearing oscillator drive circuitry to form a bond there between; and
dissolving the temporary adhesive to thereby release the second quartz substrate from the substrate bearing oscillator drive circuitry and a portion of the first quartz substrate bonded thereto via the bond formed between the metal electrode formed on the second major surface of the first quartz substrate to and the pad formed on the substrate bearing oscillator drive circuitry.

16. The method of claim 15 wherein the temporary adhesive is a petroleum-based wax.

17. The method of claim 15 wherein the metallic etch stop forms an electrode on the first major surface of the first quartz substrate.

18. The method of claim 17 wherein the electrode on the first major surface of the first quartz substrate comprises layers of Cr and Au with the Cr layer disposed closer to the first quartz substrate.

19. The method of claim 15 wherein the step of etching the via though the first quartz substrate to the etch stop comprises:
(a) defining a metallic mask on the second major surface of the first quartz substrate, the metallic mask including at least a first opening therein for said via and at least another opening therein for defining a perimeter shape of a quartz portion of said resonator; and
(b) etching through said at least a first opening in the metallic mask to thereby etch through the first quartz substrate to said etch stop and through said at least a another opening in the metallic mask to thereby etch through the first quartz substrate to define the perimeter shape of the quartz portion of said resonator.

20. The method of claim 19 wherein the etching step is performed using either a saturated ammonium bifluoride solution or hydrofluoric acid solution.

21. The method of claim 15 wherein a plurality of resonators are formed simultaneously from a single first quartz substrate, the first quart substrate having a plurality of metallic etch stops, each etch stop being each formed on a portion of the first major surface of the first quartz substrate, said portion aligning with each one of said resonators for each one of said metallic etch stops.

22. The method of claim 15 wherein a second metallic electrode is formed on a second major surface of the first quartz substrate opposing the metallic etch stop formed on the first major surface of the first quartz substrate, the second metallic electrode and the first mentioned metallic electrode being electrically isolated and physically spaced from each other.

23. The method of claim 15 wherein the first and second quartz substrates are crystalline quartz.

24. The method of claim 15 wherein the first and second quartz substrates are crystalline quartz and share a common crystal orientation.

\* \* \* \* \*